219-121 SR
MTR08 OR 3,649,807

United States Patent [15] 3,649,807
Stork [45] Mar. 14, 1972

[54] METHOD OF PRODUCING CONTACTS

[72] Inventor: Fritz Stork, Grossgartach, Germany
[73] Assignee: Telefunken Patentverwertungsgesellschaft, Ulm am Danube, Germany

[22] Filed: Oct. 1, 1969
[21] Appl. No.: 862,777

[30] Foreign Application Priority Data
Oct. 1, 1968 Germany ......................P 18 00 193.9

[52] U.S. Cl. ......................................................219/121 EB
[51] Int. Cl. ......................................................B23k 9/00
[58] Field of Search ....................156/272, 380; 29/576, 580; 117/212, 93.1; 219/121, 121 EB

[56] References Cited

UNITED STATES PATENTS 3,481,776 12/1969 Manchester ..........................117/212
2,778,926 1/1957 Schneider ..............................219/117
3,056,881 10/1962 Schwarz ..................................219/50
3,491,236 1/1970 Newberry ..............................250/495
3,516,855 6/1970 Goll et al. ..............................117/212
3,523,039 8/1970 Ramsey ................................117/212

*Primary Examiner*—J. V. Truhe
*Assistant Examiner*—Gale R. Peterson
*Attorney*—Spencer & Kaye

[57] ABSTRACT

A method of producing electrical contact to a semiconductor body having a partial covering of an insulating layer by cutting out parts of a metal foil placed thereon by means of a guided electron beam in such a way as to cause precipitation on the semiconductor device for the formation of conductive and/or resistive paths and alloying into noncovered portions of the semiconductor body for the formation of contacts joined to the conductive and/or resistive paths, and then removing the unused portions of the metal foil.

10 Claims, 3 Drawing Figures

*Inventor:*
Fritz Stork

BY *Spencer & Kaye*
ATTORNEYS.

Inventor:
Fritz Stork
BY Spencer & Kaye
ATTORNEYS.

METHOD OF PRODUCING CONTACTS

BACKGROUND OF THE INVENTION

The present invention relates to a method of producing contacts which are electrically connected to regions of a semiconductor body and which extend over an insulating layer present on the surface of the semiconductor.

Methods of making contact to semiconductor components in integrated solid-state circuits are known wherein a metal layer is vapor deposited or otherwise precipitated on a semiconductor surface structured with an oxide layer. This complete metal layer is subsequently covered with a photolacquer mask and structured in an etching solution.

SUMMARY OF THE INVENTION

It is the object of the present invention to provide a method whereby the contacts and conducting paths in semiconductor devices and integrated solid-state circuits can be produced considerably more quickly, simply and with fewer operational steps. According to the invention, there is provided a method of producing contacts and conductive paths on a semiconductor device including a semiconductor body and an insulating layer thereon defining uncovered areas of said semiconductor body to which contact is to be made, comprising the steps of laying a metal foil on the surface of said semiconductor device; guiding and controlling an electron beam over said foil to cut out portions of said foil and precipitate parts of said cut out portions onto said surface of said semiconductor device to form conducting paths and alloy further parts of said cut out portions into said semiconductor body at said uncovered areas to provide contacts with said uncovered areas of said semiconductor body which are connected to said conducting paths; and removing the unused portions of the metal foil from the surface of the semiconductor device.

BRIEF DESCRIPTION OF THE DRAWINGS

The invention will now be described in greater detail by way of example with reference to the accompanying drawings in which.

DESCRIPTION OF THE PREFERRED EMBODIMENT

Basically the method according to one embodiment of the invention provides that a metal foil should be laid on the semiconductor body and an electron beam guided over this metal foil and controlled in such a manner that parts are cut out of the foil and precipitated in the form of electrical conducting paths and/or resistance paths on the insulating layer or directly on the surface of the semiconductor, while further foil regions are alloyed into the semiconductor body in the form of contacts which are connected to the conducting or resistance paths.

After the production of the conducting paths and contacts, the parts of the foil which have not been used for the conducting paths or contacts are removed from the semiconductor body again. With the method according to the invention, masking of the metal layer with a photolacquer mask is no longer necessary. In the same manner, the etching process is eliminated which was hitherto always necessary and with which there was always the risk of undermining by etching and of losing a considerable proportion of the contact material which is generally very expensive. The material not needed can, on the other hand, with the method according to the invention, be further used for the production of new foils.

The contacts alloyed into the semiconductor body by means of an electron beam may be ohmic contacts or contacts forming barrier layers. An electron beam with a radiation energy which is lower than the radiation energy necessary for alloying in the contacts is sufficient for the production of the conducting and/or resistance paths. Accordingly, the radiation energy of the electron beam is preferably controlled by means of a pre-programmed computer. The required width of the conducting paths and the extent in area of the contacts can also be determined in a particularly simple manner by varying the cross section of the electron beam. In this case, too, it has proved suitable to control the cross section of the electron beam by means of a pre-programmed computer.

Since the width of the electron beam and hence the width of the conducting paths cut out of the foil and precipitated on the surface of the semiconductor and/or on the insulating layer can be varied in a very simple manner, conducting paths acting as electrical resistors can also be produced by means of the method of the invention and be connected to further components present in the semiconductor body. In this case, the magnitude of the resistance is determined by the selection of the cross section of the electron beam and by the length of the resistance paths.

Aluminum or gold is suitable as a material for the foils for example; the foils generally have a thickness between 25 and 50 $\mu$m. Silicon dioxide, silicon oxide or silicon nitride is suitable, for example, as an insulating layer on the semiconductor body.

Figures 1, 2:
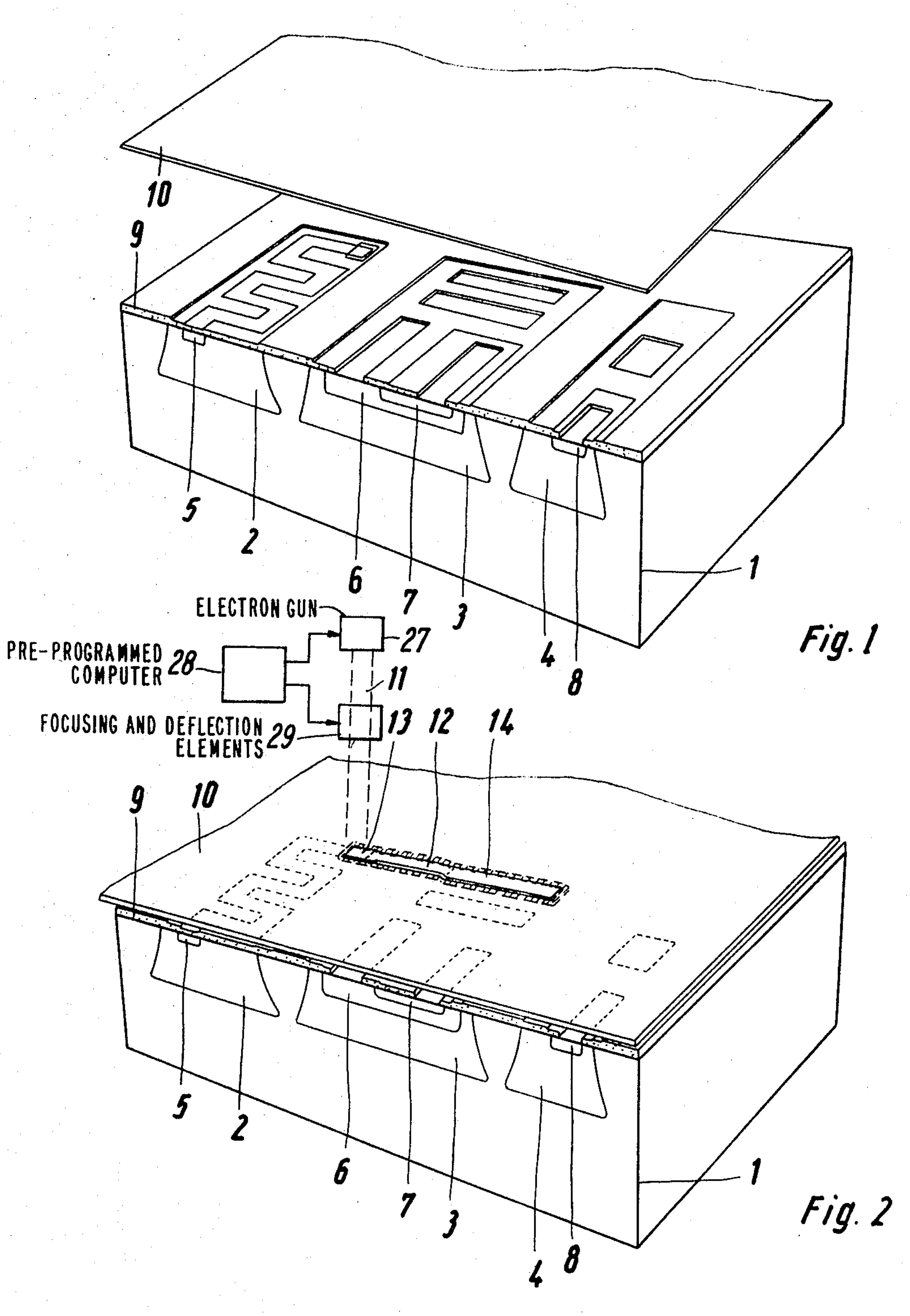
FIG. 1 is a view partly in perspective view and partly in section of a semiconductor device at a first stage in carrying out a method in accordance with the invention.
FIG. 2 is a view similar to FIG. 1 showing a second stage of the method.

Referring now to FIG. 1 of the accompanying drawings there is shown, partly in section, partly in perspective view, a semiconductor body 1 which contains components of an integrated solid-state circuit for example.

In order to manufacture the individual components, three regions 2 to 4, separate from one another, of a second type of conductivity may be introduced by means of the known masking and diffusion technique into the semiconductor body 1 of monocrystalline silicon or germanium of a first type of conductivity. A serpentine region 5 of the first type of conductivity is diffused into the region 2 as an electrical resistance. A base region 6 of the first type of conductivity is diffused into the region 3, which serves as a collector region of a transistor, and an emitter region 7 of the second type of conductivity is diffused into the base region. A further region 8 which is surrounded by a PN junction is introduced into the region 4, said PN junction being utilized as a diode. The semiconductor surface is covered with a structured oxide layer 9, for example of silicon dioxide, which is used as a mask in all diffusion processes. In the arrangement shown in FIG. 1, the oxide layer covers the entire surface of the semiconductor with the exception of the areas adapted for making contact in the individual regions introduced into the semiconductor body. In FIG. 1, a metal foil 10 which is laid on the semiconductor body is indicated above the semiconductor body. In this case the foil is adjusted to the structure of the semiconductor surface and then held on the surface in the adjusted position.

According to FIG. 2, an electron beam 11 from an electron gun 27 is now guided over the foil 10 and selectively controlled with regard to its cross section, its radiation energy and its advance, e.g., by means of a programmed computer 28 which controls the electron gun 27 and the focusing and deflecting elements 29 for the beam 11. Wherever the electron beam 11 impinges on the foil 10 over the oxide layer 9, the foil material is heated, vaporized and at the same time deposited on the oxide layer as a conducting path 12. Over the contact points 13 and 14 to the semiconductor regions of the semiconductor components in the semiconductor body, the radiation energy of the electron beam is increased to such an extent that the foil material is alloyed into the semiconductor region in question. In this manner, permanent and satisfactory contacts are obtained which, at the same time, are electrically connected to the conducting paths extending over the oxide layer 9.

Figure 3:
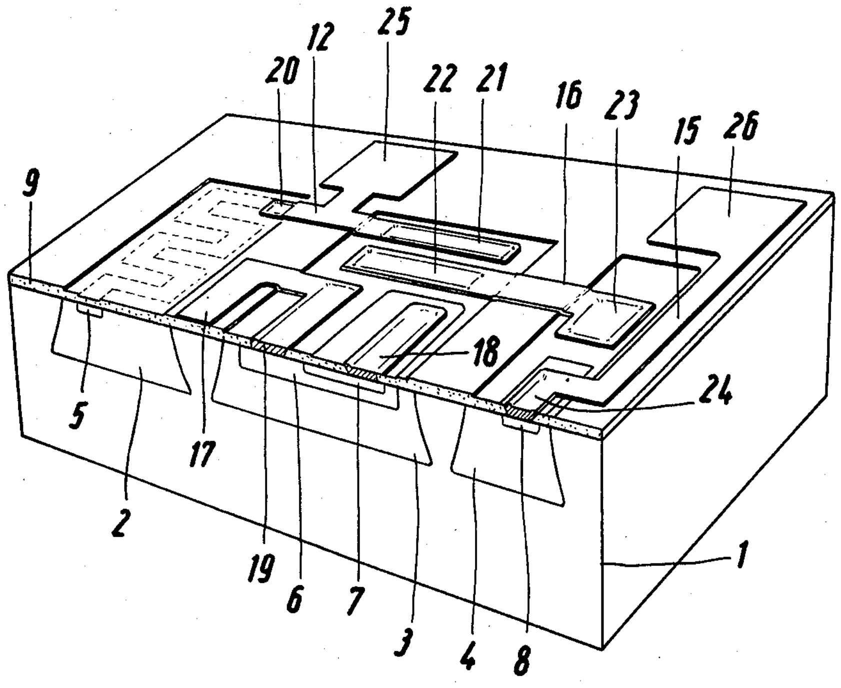
FIG. 3 is a further view similar to FIG. 1 showing the semiconductor device in the finished condition.

FIG. 3 illustrates the finished semiconductor device after the parts of the metal foil 10 (FIG. 1) which are not necessary for conducting paths and contacts have been removed again.

FIG. 3 illustrates the conducting paths 12, 15, 16 and 17 which are of different widths, the contacts 18 to 23 to the individual semiconductor regions and the large-area connecting areas 25 and 26 to the integrated circuit. The method according to the invention is particularly suitable for making contact to integrated monolithic solid-state circuits, as the example described with reference to the Figure shows. It may also be used, however, for making contact to planar transistors, planar diodes or other semiconductor devices.

It will be understood that the above description of the present invention is susceptible to various modifications, changes and adaptations.

What I claim as new and desire to secure by Letters Patent of the United States is:

1. A method of producing contacts and conductive paths on a semiconductor device including a semiconductor body and an insulating layer on a surface thereof defining uncovered areas of said semiconductor body to which contact is to be made, comprising the steps of laying a metal foil on the surface of said insulating layer and over said uncovered areas; guiding and controlling an electron beam, with respect to its radiant energy, its cross-sectional width and its advance movement, over said foil to cut out portions of said foil and precipitate parts of said cut out portions on to said surface of said semiconductor device to form conducting paths and to alloy further parts of said cut out portion into said semiconductor body at said uncovered areas to provide contacts with said uncovered areas of said semiconductor body and which are connected to said conducting paths; and, removing the portions of said foil which are not used as conductive paths or contacts from said surface of said insulating layer.

2. A method as defined in claim 1, wherein at least some of said conducting paths are resistance paths.

3. A method as defined in claim 1, wherein the alloyed contacts are ohmic contacts.

4. A method as defined in claim 1, wherein at least one of the alloyed contacts forms a barrier layer with the semiconductor body.

5. A method as defined in claim 1, further comprising controlling, by means of a pre-programmed computer, the radiation energy of said electron beam to be lowered during the production of said conducting paths than during the alloying in of said contacts.

6. A method as defined in claim 1, further comprising controlling the cross section of said electron beam by means of a pre-programmed computer to determine the particular required width of the conducting paths and the extent in area of the contacts.

7. A method as defined in claim 1, further comprising cutting out by said electron beam on said foil which has been layed down a structure acting as an electrical resistance and connected to further components present in the semiconductor body, and precipitating said structure on the insulating layer, the magnitude of the resistance being determined by the selection of the cross section of the electron beam.

8. A method as defined in claim 1, wherein a foil selected from the group consisting of aluminum foil and gold foil and having a thickness of between 25 and 50 $\mu$m. is used as said foil.

9. A method as defined in claim 1, wherein said insulating layer consists of a material selected from the group consisting of silicon dioxide, silicon oxide and silicon nitride.

10. A method as defined in claim 1, further comprising adjusting the foil to the structure of said semiconductor device surface and holding it on the semiconductor device surface in the adjusted position during application of the electron beam.

* * * * *